(12) United States Patent
Aslami

(10) Patent No.: US 8,613,984 B2
(45) Date of Patent: Dec. 24, 2013

(54) PLASMA VAPOR DEPOSITION SYSTEM AND METHOD FOR MAKING MULTI-JUNCTION SILICON THIN FILM SOLAR CELL MODULES AND PANELS

(76) Inventor: Mohd Aslami, Sturbridge, MA (US)

(*) Notice: Subject to any disclaimer, the term of this patent is extended or adjusted under 35 U.S.C. 154(b) by 0 days.

(21) Appl. No.: 13/428,445

(22) Filed: Mar. 23, 2012

(65) Prior Publication Data
US 2012/0178202 A1  Jul. 12, 2012

Related U.S. Application Data

(62) Division of application No. 12/216,091, filed on Jun. 30, 2008.

(51) Int. Cl.
*C23C 16/458* (2006.01)

(52) U.S. Cl.
USPC .......... 427/569; 427/248.1; 118/730

(58) Field of Classification Search
None
See application file for complete search history.

(56) References Cited

U.S. PATENT DOCUMENTS

| | | | |
|---|---|---|---|
| 5,076,203 A * | 12/1991 | Vaidya et al. | 118/718 |
| 2002/0037602 A1 * | 3/2002 | Okada et al. | 438/96 |
| 2006/0226517 A1 * | 10/2006 | Iwanaga et al. | 257/639 |
| 2008/0188062 A1 * | 8/2008 | Chen et al. | 438/483 |

* cited by examiner

*Primary Examiner* — Joseph Miller, Jr.
(74) *Attorney, Agent, or Firm* — Patton Boggs LLP (57) ABSTRACT

A plasma vapor deposition system for making multi-junction silicon thin film solar cell modules and panels including a flexible substrate disposed about and removably supported by a dual-walled cylindrical substrate support for axially rotating the flexible substrate about its longitudinal axis, the dual-walled cylindrical substrate support comprising an inner wall spaced apart by an outer wall to define a coaxial cavity; a plasma vapor deposition torch located substantially adjacent to the flexible substrate for depositing at least one thin film material layer on an outer surface of the flexible substrate; and a traversing platform for supporting the rotatable substrate support relative to the plasma vapor deposition torch, the rotatable substrate support being traversed along its longitudinal axis by the traversing platform.

17 Claims, 6 Drawing Sheets

PLASMA VAPOR DEPOSITION SYSTEM AND METHOD FOR MAKING MULTI-JUNCTION SILICON THIN FILM SOLAR CELL MODULES AND PANELS

RELATED APPLICATIONS

This application is a division of U.S. Ser. No. 12/216,091 filed Jun. 30, 2008.

FIELD OF THE INVENTION

The present invention relates to a vapor deposition apparatus, and more particularly to a plasma vapor deposition system and method for making silicon thin film solar cell modules and panels.

Problem

Without limiting the scope of the present invention, its background will be described in relation to a plasma vapor deposition system and method for making multi-junction silicon thin film solar cell modules and panels, as an example.

As oil prices have continued to increase and other energy sources remain limited, there also is increasing pressure on global warming from the emissions of burning fossil fuel. There is a need to find and use alternative energy sources, such as solar energy because it is free and does not generate carbon dioxide gas. To that end, many nations are increasing their investment in safe and reliable long-term sources of power, particularly "green" or "clean" energy sources. Nonetheless, while the solar cell, also known as a photovoltaic cell or modules, has been developed for many years, it had very limited usage because the cost of manufacturing these cells or modules is still high, making it difficult to compete with energy generated by fossil fuel.

Presently, the single crystal silicon solar cell has the best energy conversion efficiency, but it also has the highest manufacture cost. Alternatively, thin-film silicon while it does not have the same high efficiency of a single crystal cell as of yet, it is much cheaper to produce. Therefore, it has the potential for low cost photovoltaic power generation. Other types of thin-film materials such as copper indium gallium diselenide ("CIGS") also showed promising results with efficiencies approaching that of single crystal silicon, at a lower cost, but still not low enough to compete effectively with fossil fuel.

Part of the reason for the manufacturing expense is that the deposition rates of these processes are low and time consuming. For example, the typical process of plasma glow discharge of silane in the presence of a high concentration of hydrogen gas to form the desired silicon layer achieves a deposition rate of approximately 20 A/s or 0.12 microns/minute. For another example, the typical plasma chemical vapor deposition ("CVD") method for forming high quality i-type silicon layer achieves a reported deposition rate of approximately 15 A/s or 0.09 microns/minute. In yet another example, the typical chemical vapor transport ("CVT") method, which uses iodine vapor as a transport medium to deposit polycrystalline silicon, achieved film growth rates up to approximately 3 microns/minute. The best reported deposition rate for Plasma-Enhanced Chemical Vapor Deposition ("PECVD") is approximately 5 A/s.

Furthermore, in addition to slow deposition rates, another slow process step found commonly in the manufacture of solar cells involves the incorporation of p-type and n-type doped thin films. This multi-step process is normally performed in extremely slow diffusion furnaces after the thin-film layer has already been deposited, thus further slowing down the overall process of efficiently producing solar cells.

Information relevant to attempts to address these problems can be found in the U.S. Pat. Nos. 5,646,050 issued Jul. 8, 1997 to Li, et al.; 5,942,049 issued Aug. 24, 1999 to Li, et al.; 6,100,466 issued Aug. 8, 2000 to Nishimoto; 6,214,706 issued Apr. 10, 2001 to Madan, et al.; 6,281,098 issued Aug. 28, 2001 to Wang, et al.; 5,141,564 issued Aug. 25, 1992 to Chen, et al.; 4,798,660 issued Jan. 17, 1989 to Ermer, et al.; 4,915,745 issued Apr. 10, 1990 to Pollock, et al.: 6,048,442 issued Apr. 11, 2000 to Kushiya, et al.; 6,258,620 issued Jul. 10, 2001 to Morel, et al.; 6,518,086 issued Feb. 11, 2003 to Beck, et al.; 5,045,409 issued Sep. 3, 1991 to Eberspacker, et al.; 5,356,839 issued Oct. 18, 1994 to Tuttle, et al.; 5,441,897 issued Aug. 15, 1995 to Noufi, et al.; 5,436,204 issued Jul. 25, 1995 to Albin, et al.; 5,730,852 issued Mar. 24, 1998 to Bhattacharya, et al.; 5,804,054 issued Sep. 8, 1998 to Bhattacharya, et al.; 5,871,630 issued Feb. 16, 1999 to Bhattacharya, et al.; 5,976,614 issued Nov. 2, 1999 to Bhattacharya, et al.; 6,121,541 issued Sep. 19, 2000 to Arya; 6,368,892 issued Apr. 9, 2002 to Arya; 3,993,533 issued Nov. 23, 1976 to Milnes et al.; 4,891,074 issued Jan. 2, 1990 to Ovshinsky; 5,231,048 issued Jul. 27, 1993 to Guha et al.; 6,613,974 issued Sep. 2, 2003 to Husher; and 6,670,544 issued Dec. 30, 2003 to Kibbel et al.

Solution

The above-described problems are solved and a technical advance achieved by the plasma vapor deposition system and method for making multi-junction silicon thin film solar cell modules and panels ("system for making solar cell modules and panels") disclosed in this application. The novel system provides a measurably higher deposition rate, thus leading to a much lower manufacturing cost. Adding appropriate multi-layers or "multi-junction" thin film solar cells increases the conversion efficiency of solar energy, which results in higher total conversion efficiency compared to a single layer or "single-junction" solar cell. This leads to further decreases in manufacturing costs of solar cells, solar cell modules, and solar cell panels.

The present system for making solar cell modules and panels uses an induction coupled plasma torch that provides for high purity deposited materials, better composition and structure control, uniformity in layer thicknesses, large and various sizes of solar cell panels, and numerous combinations of different types of thin film layers. Instead of using a diffusion process to make p-type and n-type doped thin films eliminates the multi-step diffusion process, which results in significantly lower manufacturing costs. In addition, the system for making solar cell modules and panels deposits thin film layers on large areas of flexible substrates, such as stainless steel foil, which are supported by a rotating cylindrical drum, for example.

The system for making solar cell modules and panels does not require different kinds of equipment for depositing different absorbing layers, thus there is no need to move or relocate the deposition target to different equipment or deposition stages. The system for making solar cell modules and panels saves overall manufacturing time, minimizes manufacturing mistakes, and decreases manufacturing bottleneck issues caused by different processing times and different processing equipment. The system for making solar cell modules and panels provides for all thin film layers to be deposited in one chamber where only the chemicals fed into a plasma vapor deposition torch are changed.

In one aspect, the plasma vapor deposition system for making multi-junction silicon thin film solar cell modules and panels includes a flexible substrate disposed about and removably supported by a rotatable substrate support; and a plasma vapor deposition torch located substantially adjacent to the flexible substrate for depositing at least one thin film material layer on an outer surface of the flexible substrate. In one embodiment, the rotatable substrate support is a temperature controlled cylinder. Further, the rotatable substrate support may include an outer wall and an inner wall spaced apart from the outer wall, the outer wall and inner wall defining a coaxial compartment; and a heating/cooling coil located within the coaxial compartment for providing at least one of heating and cooling to the outer surface of the outer wall. In another embodiment, the flexible substrate comprises a sheetlike material capable of withstanding deposition temperatures of the plasma vapor deposition torch. Further, the flexible substrate may be selected from stainless steel and high temperature polyimide film. The plasma vapor deposition torch may be a inductively coupled plasma torch.

In another aspect, the plasma vapor deposition system for making multi-junction silicon thin film solar cell modules and panels includes a flexible substrate disposed about and removably supported by a dual-walled cylindrical substrate support for axially rotating the flexible substrate about its longitudinal axis, the dual-walled cylindrical substrate support comprising an inner wall spaced apart by an outer wall to define a coaxial cavity; a plasma vapor deposition torch located substantially adjacent to the flexible substrate for depositing at least one thin film material layer on an outer surface of the flexible substrate; and a traversing platform for supporting the rotatable substrate support relative to the plasma vapor deposition torch, the rotatable substrate support being traversed along its longitudinal axis by the traversing platform.

In one embodiment, the dual-walled cylindrical substrate support may further include at least one of a heating and cooling element located within the coaxial cavity. Also, the dual-walled cylindrical substrate support may further include a controller for controlling at least one of a heating and cooling element. The dual-walled cylindrical substrate support may further include a rotatable connector in fluid communication with the coaxial cavity for transmitting a gas through the coaxial cavity. In another embodiment, the dual-walled cylindrical substrate support may have a length of at least 125 centimeters. In yet another embodiment, the dual-walled cylindrical substrate support may have a diameter of at least 20 centimeters. Further, the dual-walled cylindrical substrate support may have electric coils located within the coaxial cavity. The plasma vapor deposition torch may be a inductively coupled plasma torch.

In yet another aspect, the present invention is directed to a method for making multi-junction silicon thin film solar cell modules and panels including providing a rotatable substrate support; providing a high frequency induction coupled plasma torch comprising a coil, the induction coupled plasma torch being selected positionable along the surface area of rotatable substrate support; mounting a flexible sheet-like substrate about an outer surface of the rotatable substrate support, the flexible sheet-like substrate substantially taking the shape of the rotatable substrate support; introducing a plasma gas into the high frequency induction coupled plasma torch to form a plasma within the coil; injecting at least one source chemical into the high frequency induction coupled plasma torch; and depositing at least one thin film layer on the outer surface of the sheet-like flexible substrate.

In one embodiment, the method may further include controlling the temperature of the rotatable substrate support. It may also include flowing a gas through the rotatable substrate support to control its temperature. Further, it may include traversing the sheet-like flexible substrate back and forth along its longitudinal axis relative to the high frequency induction coupled plasma torch. It may also include rotating the sheet-like flexible substrate about its longitudinal axis relative to the high frequency induction coupled plasma torch.

In another embodiment, the method include depositing at least one of a n-type doped silicon layer, an i-type pure silicon layer, and a p-type doped silicon layer on the outer surface of the sheet-like flexible substrate. Additionally, at least one source chemicals is selected from the group consisting of $SiCl_4$, $SiHCl_3$, $SiH_4$, $SiF_4$, or other silicon containing compound, $PH_3$, and $B_2H_6$ as well as $GeH_4$, $GeCl_4$, $GeF_4$ or other germanium containing compounds. The source chemicals may be in a form selected from the group consisting of a gas, vapor, aerosol, small particle, and powder.

In yet another embodiment, the method may include depositing a thin film layer of transparent conductive metal oxide on the outer surface of the sheet-like flexible substrate after the deposition of at least one thin film layer. The transparent conductive metal oxide is an oxide selected from the group consisting of indium, tin, and zinc. The plasma gas is selected from the group consisting of helium, neon, argon, hydrogen and mixtures thereof. The silicon thin film solar cell modules are selected from the group consisting of p-i-n and n-i-p type layered structures. Further, the method may include cutting the solar cell modules into smaller portions to be mounted on a substrate for producing a solar cell panel.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE DRAWINGS

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the present invention.

Figure 1:
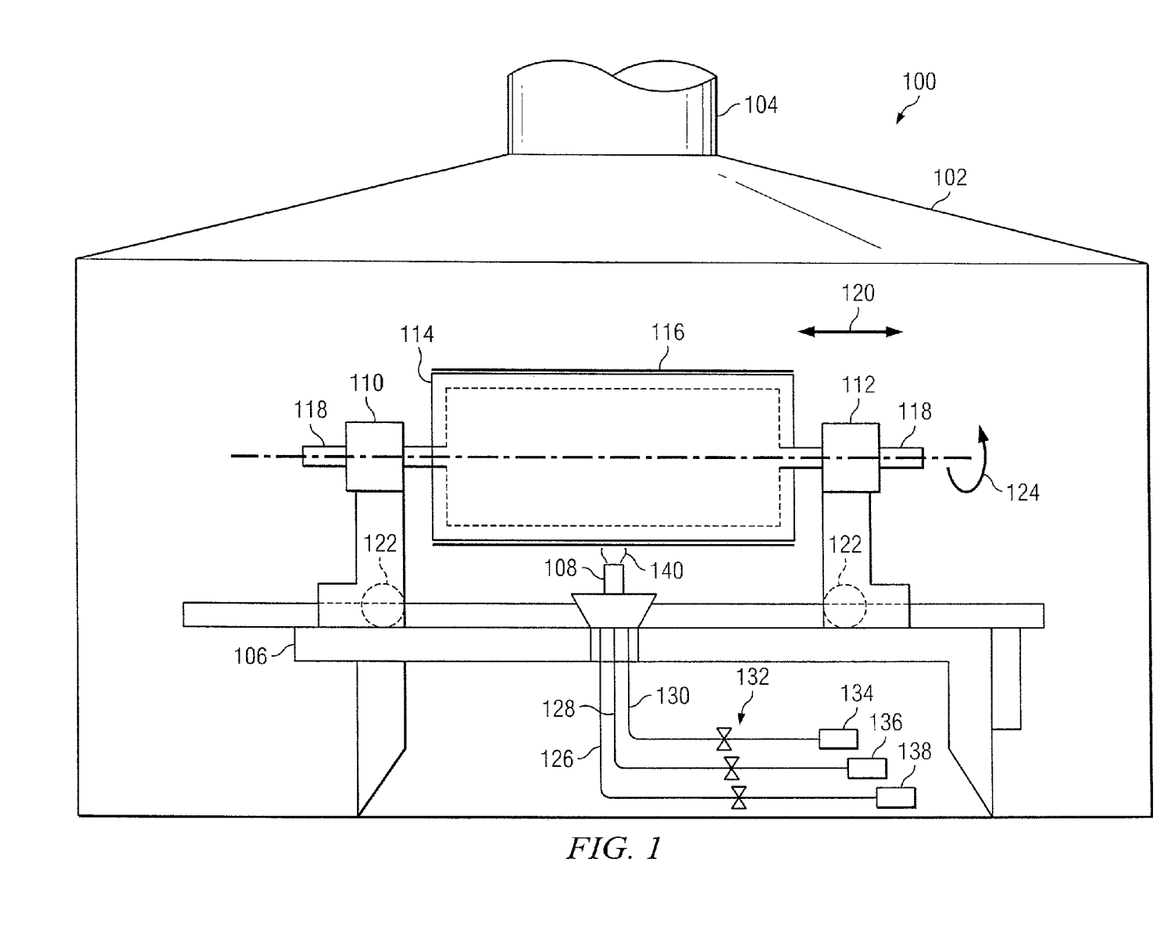
FIG. 1 illustrates a front view of a system for making solar cell modules and panels according to an embodiment of the present invention.

In the following description of the representative embodiments of the invention, directional terms, such as "above", "below", "upper", "lower", etc., are used for convenience in referring to the accompanying drawings. FIG. 1 illustrates an embodiment of a system for making solar cell modules and panels that is schematically illustrated and generally designated 100. System for making solar cell modules and panels 100 includes a chamber 102 which is sealed so as to prevent impurities from being introduced into the final product. In addition, chamber 102 may be made from explosive proof materials and be shielded from radio frequencies emissions protect workers operating or working near chamber 102. Chamber 102 may include an exhaust subsystem 104 for removing by-product gases, fumes, and particles from chamber 102. Exhaust subsystem 104 may further provide pressure and partial pressure control functionality within chamber 102 such that optimal conditions within chamber 102 may be maintained.

Chamber 102 includes a platform 106 that supports a plasma vapor deposition torch 108 that emits a plasma flame 140 to deposit thin film solar cell material 418 (FIG. 4) onto the outer surface of a substrate 116 as further described herein. Plasma vapor deposition torch 108 may be mounted or disposed on a surface of platform 106 such that it is fixed or movable as desired. In one embodiment, plasma vapor deposition torch 108 is fixed in an upwardly or vertical direction for depositing source chemicals on substrate 116 supported by substrate support 114 that may be located above plasma vapor deposition torch 108. In another embodiment, plasma vapor deposition torch 108 may be positioned or disposed in any other orientation relative to substrate support 114 and substrate 116. Platform 106 may further include a headstock 110 and a tailstock 112 that are mounted or disposed on platform 106 for rotatably supporting substrate support 114 which is located between them. Disposed about substrate support 114 is a substrate 116 for depositing chemicals from plasma vapor deposition torch 108 as described further below.

The headstock 110 and the tailstock 112 may include a pair of opposing rotating spindle chucks that may rotatably engage ends 118 of substrate support 114. In one embodiment, platform 106 and plasma vapor deposition torch 108 are stationary relative to headstock 110 and tailstock 112, such that headstock 110 and tailstock 112 move in a traversing direction back and forth relative to platform 106 and plasma vapor deposition torch 108. In this manner, substrate support 114 is moved laterally back and forth in a direction illustrated and generally designated 120. Headstock 110 and tailstock 112 may include mechanisms, such as rollers 122 to facilitate the traversing motion of headstock 110 and tailstock 112 relative to platform 106. Further, the movement or travel of headstock 110 and tailstock 112 may be synchronized, such that they move or traverse synchronously together in direction 120 relative to plasma vapor deposition torch 108. In another embodiment, headstock 110, tailstock 112, platform 106, and substrate support 114 are stationary relative to plasma vapor deposition torch 108, such that plasma vapor deposition torch 108 moves in a traversing direction back and forth relative to headstock 110, tailstock 112, platform 106, and substrate support 114.

In addition, headstock 110 and tailstock 112 may be part of a movable carriage as is commonly known where it may be cooperatively attached to the platform 106, in an arrangement permitting travel in either direction 120 relative to plasma vapor deposition torch 108. Additionally, plasma vapor deposition torch 108 may be cooperatively attached to a movable carriage, in an arrangement permitting travel in either direction 120 relative to headstock substrate support 114 and substrate 116. Headstock 110 and tailstock 112 further rotate in a direction illustrated and generally designated 124 relative to platform 106. In this way, substrate support 114 and substrate 116 may be rotated in direction 124 relative to plasma vapor deposition torch 108. In this aspect, headstock 110 and tailstock 112 rotate substrate support 114 and substrate 116 to ensure that chemicals from plasma vapor deposition torch 108 are uniformly deposited by plasma vapor deposition torch 108 on substrate 116.

Additionally, platform 106, headstock 110, and tailstock 112 may include adjustable height mechanisms for adjusting the distance between plasma vapor deposition torch 108 and substrate support 114 and substrate 116. The height adjustments may be capable of dynamic incremental adjusting for continuous height adjusting during a deposition operation to provide for a constant distance between plasma vapor deposition torch 108 and substrate support 114 and substrate 116. In another aspect, a continuous distance may be provided between plasma vapor deposition torch 108 and substrate 116.

As another alternative, a plurality (not shown) of plasma vapor deposition torches 108 may be spaced apart along the length of substrate support 114 and substrate 116. This provides for reduced movement of either the headstock 110 or tailstock 112 of platform 106 to which the plasma vapor deposition torches 108 are attached. If a sufficient number of plasma vapor deposition torches 108 are provided all along the length of substrate support 114 and substrate 116, then no movement of headstock 110, tailstock 112, substrate support 114, and substrate 116 may be necessary.

In addition, a coolant supply 134 may be provided to plasma vapor deposition torch 108 via supply line 130 for cooling plasma vapor deposition torch 108 as further described herein. Further, a source chemical supply 136 provide a supply of source chemicals to plasma vapor deposition torch 108 via supply line 128 as further described herein. Also, a gas supply 138 for providing plasma forming gases to plasma vapor deposition torch 108 for supporting the induction coupled plasma of plasma vapor deposition torch 108 is supplied to plasma vapor deposition torch 108 via supply line 126. Valves 132 may be located on supply lines 126, 128, and 130 for controlling the supplies of these chemicals and compounds for supporting the plasma vapor deposition on substrate 116 with plasma vapor deposition torch 108. In addition, additional bubblers, mass flow controllers, driers, and the like may also be located on supply lines 126, 128, and 130 for providing additional support to the chemicals and compounds being fed to plasma vapor deposition torch 108. In addition, supply lines 126, 128, and 130 may branch or split off to provide more than one supply line to plasma vapor deposition torch 108 for its operation.

Figure 2:
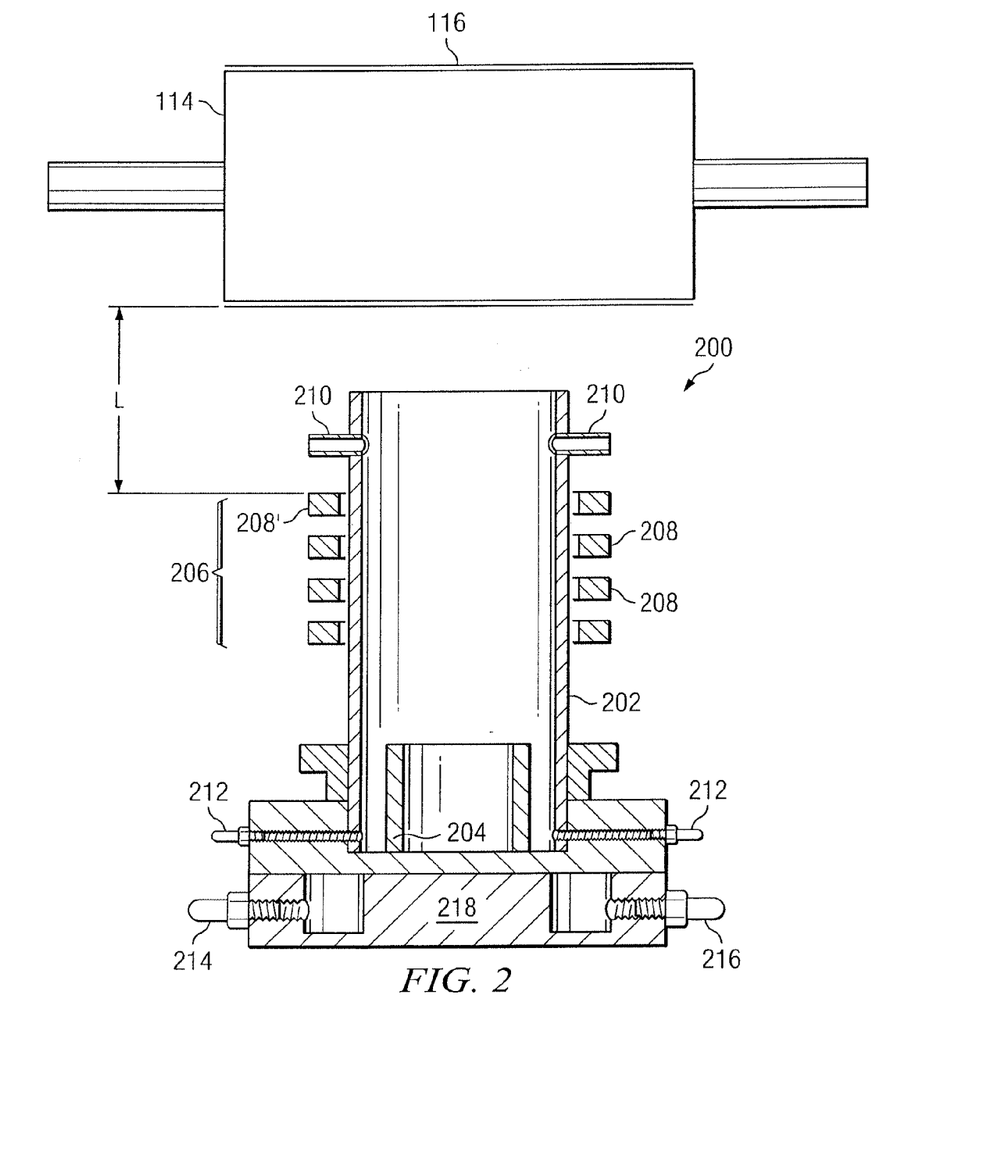
FIG. 2 illustrates a cross-sectional view of a plasma vapor deposition torch of the system for making solar cell modules and panels according to an embodiment of the present invention.
Figure 3:
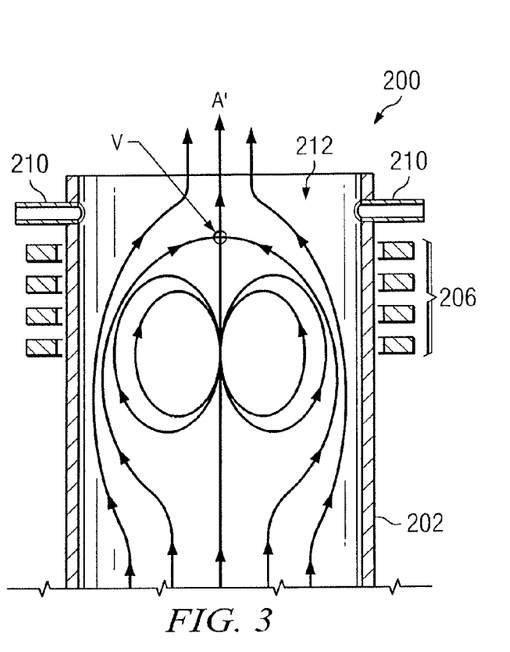
FIG. 3 illustrates a cross-sectional view of plasma vapor deposition torch of FIG. 2 showing the gas and field flow pattern according to another embodiment of the present invention.

Referring now to FIGS. 2 and 3 collectively, an embodiment of an inductively coupled plasma vapor deposition torch 200 ("plasma vapor deposition torch 200") is further illustrated and described. Plasma vapor deposition torch 200 is shown in relative position below substrate support 114 and substrate 116. Plasma vapor deposition torch 200 includes an outer quartz tube 202 coaxially located outside an inner quartz tube 204. Typically, the diameter and height or length of outer quartz tube 202 and inner quartz tube 204 may be any size to fit the desired application of system for making solar cell modules and panels 100. Preferably, the inner quartz tube 204 is a shorter length than outer quartz tube 202. Also, outer quartz tube 202 preferably has a diameter in the range of from about 50 millimeters ("mm") to about 90 mm and a height in the range of from 180 mm to about 400 mm. More preferably, the diameter for outer quartz tube 202 is about 70 mm with a height or length of about 200 mm. Preferably, the inner quartz tube 204 has a diameter in the range of from about 50 mm to about 70 mm and a height in the range of from about 120 mm to about 180 mm. More preferably, the diameter of the inner quartz tube 204 is about 60 mm with a height of about 150 mm.

Plasma vapor deposition torch 200 further includes a coil 206, such as a copper induction coil, that is located around the upper portion of outer quartz tube 202. Coil 206 comprises a plurality of windings 208 having a diameter of approximately in the range of from about 56 mm to about 96 mm. Preferably, the plurality of windings 208 have a diameter of about 82 mm. Typically, the plurality of windings 208 are spaced apart from each other by a sufficient distance to provide for operation of plasma vapor deposition torch 200. Preferably, the plurality of windings 208 are spaced apart from each other by about 6 mm. In addition, a gap between outer quartz tube 202 and coil 206 can be in a range of from about 2 mm to about 10 mm. Also, the distance between the uppermost portion of coil 206 and substrate 116, is designated by "L," which is a distance in the range of from about 30 mm to about 55 mm, for example.

Plasma vapor deposition torch 200 further includes a pair of injection ports 210 that are connected to source chemical supply 136 carrying the source chemicals to plasma vapor deposition torch 200. With the use of inner quartz tube 204, the plasma forming gas will have a swirl flow pattern 212. (See FIG. 3) The source chemicals for deposition of thin film solar cell material 418 (FIG. 4) on substrate 116 may be injected through injection ports 210, which are preferably located relative to plasma vapor deposition torch 200 and aimed toward the V=0 position for the same reason as disclosed in U.S. Pat. No. 6,253,580 issued to Gouskov et al. and U.S. Pat. No. 6,536,240 issued to Gouskov et al, both of which are incorporated herein by reference. In one embodiment, injection ports 210 are connected to or disposed on plasma vapor deposition torch 200. In another embodiment, the injection ports 210 are not connected to or disposed on the plasma vapor deposition torch 200, but are connected to or disposed on another structural element of system for making solar cell modules and panels 100 as herein described. For example, injection ports 210 may be supported by a separate support structure sufficient to provide an optimal injection of the source chemicals into the plasma flame. In one embodiment, the plasma vapor deposition torch 200 is an inductively coupled plasma torch. The injection ports 210 comprise quartz tubing preferably having a diameter in the range of from about 3 mm to about 10 mm, more preferably of about 5 mm, although tubing diameters in other sizes may be used with plasma vapor deposition torch 200. In this embodiment, injection ports 210 are positioned diametrically across from each other. In another embodiment of the present invention, three or more injection ports 210, symmetrically arranged, may be utilized.

Further, plasma vapor deposition torch 200 includes a pair of plasma gas inlets 212 that are connected to gas supply 138 via supply line 128 carrying plasma forming gases to plasma vapor deposition torch 200. Plasma gas inlets 212 enter plasma vapor deposition torch 200 at substantially the same height. Preferably, plasma gas inlets 212 comprise stainless steel tubing having a diameter of 5 mm, although a range of diameters may suffice for this purpose.

Plasma vapor deposition torch 200 is also provided with coolant supply 134 via supply line 130 through coolant inlet 214. During use, a coolant, such as water, passes through the coolant inlet 122, circulates within a chamber 218, such as a stainless steel chamber, and exits through a coolant outlet 216. The coolant inlet 214 and coolant outlet 216 are preferably formed from stainless steel and have a diameter of 5 mm, for example. In one embodiment, plasma gas inlets 212, coolant inlet 214, and coolant outlet 216 are all preferably formed in chamber 218. Chamber 218 may be preferably a stainless steel square block 80 mm on a side, and having a height of approximately 40 mm, for example. As would be commonly understood, chamber 218 may be any size and made from any material suitable for use with plasma system for making solar cell modules and panels 100. Chamber 218 may be mounted onto the support stand (not shown).

A high frequency generator (not shown) is electrically connected to coil 206, powering it with a variable power output up to 60 kW at a frequency of 5.28+/−0.13 MHz. In an embodiment, the generator is Model No. IG 60/5000, available from Fritz Huettinger Electronic GmbH of Germany. This generator is driven with a 50 Hz, 3-phase, 380 V power supply to energize plasma vapor deposition torch 200.

Figure 4:
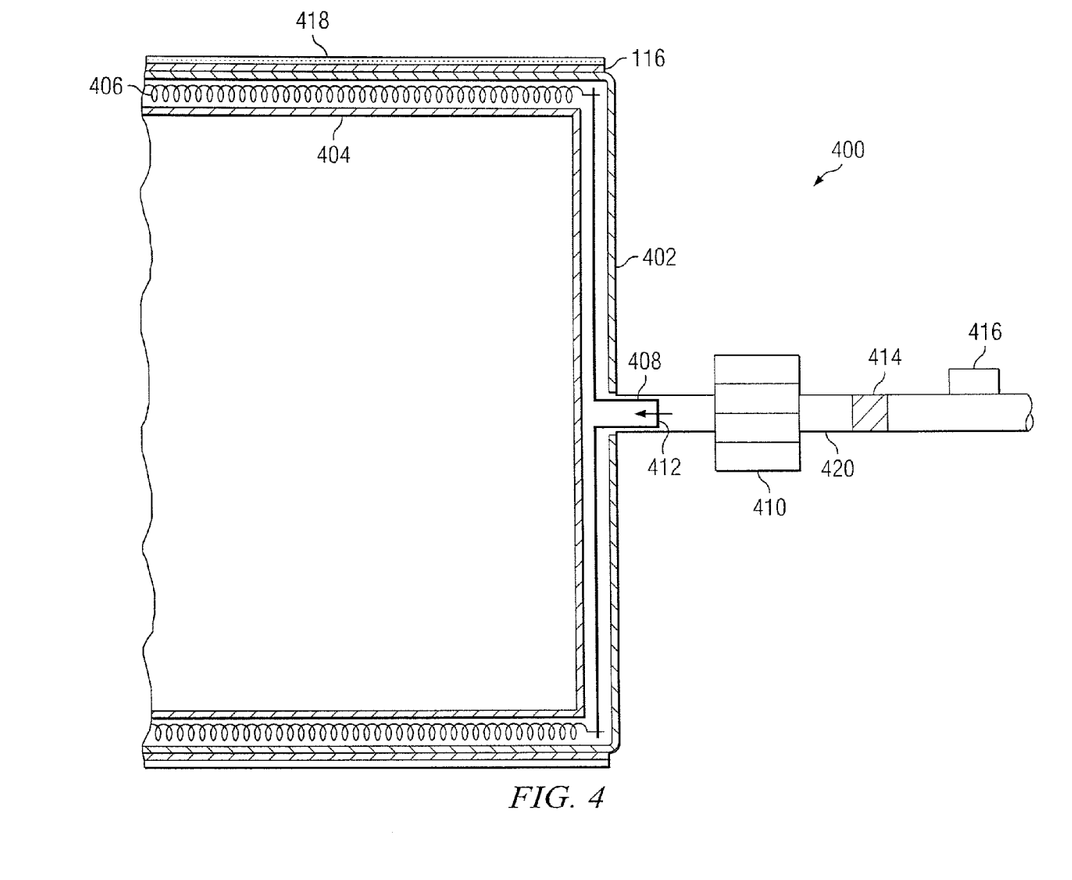
FIG. 4 illustrates a cross-sectional view of an end portion of substrate support of the system for making solar cell modules and panels according to an embodiment of the present invention.

Referring now to FIG. 4, an embodiment of a substrate support 400 is further illustrated and described. A partial view of one end of substrate support 400 is shown. Substrate support 400 may be supported between headstock 110 and tailstock 112 for locating it relative to plasma vapor deposition torch 108 for receiving chemicals that are produced by plasma vapor deposition torch 108 from source chemicals. Substrate support 400 may include an inner wall 404 and an outer wall 402 spaced apart to provide adequate temperature control for the deposition of thin film solar cell material 418. Thin film solar cell material 418 may be one or more of the thin film layers deposited by system for making solar cell modules and panels 100 as described herein. Additionally, thin film solar cell material 418 may include a partially deposited thin film solar cell material 418 or the completed thin film solar cell material 418 as described herein. In general, the deposition steps described herein may include deposition layers being deposited on top of previous deposited layers, all of which may be referred to as thin film solar cell material 418. In general, substrate 116 is disposed about the outer surface of outer wall 402 of substrate support 400. Substrate support 400 may be constructed in any manner such that it sufficiently provides support to substrate 116 during deposition of thin film solar cell material 418. For example, substrate support 400 may be a double-walled or dual-walled construction such that the temperature controlled heat exchange gases or liquids are able to flow through the system for making solar cell modules and panels quickly while maintaining a desired substrate temperature.

In one embodiment, located between outer wall 402 and inner wall 404 is a heating or cooling coil 406 to provide additional temperature control to the outer surface of outer wall 402 of substrate support 400. Electricity may be supplied to coil 406 by a slip ring 412 in connection with a power source, for example. In addition, a gear 410 and a rotational coupler 414 may provide rotational force through a drum axle 414. A motor may be in contact or communication with gear 410 and/or drum axle 414 to impart the rotational force upon drum axle 414 for rotating substrate support 400 relative to plasma vapor deposition torch 108, in one aspect. In one embodiment, gear 410 may be attached to drum axle 414 such that rotating drum axle 420 will have the direct coupling to the driving mechanism such as a gear or a chain. Preferably, substrate support 400 is symmetrically rotated about its major axis. In another embodiment, substrate support 400 may be mounted on spindles or chucks to hold substrate support 400 in place while providing rotational force to substrate support 400. Spindles or chucks may be under influence of a motor to impart such rotational force to substrate support 400. Further, the ends of substrate support 400 may include quick disconnecting rotational couplers for rapid engaging and disengaging of substrate support 400 from headstock 110 and tailstock 112.

A heating/cooling temperature controller 416 may further be located proximal to substrate support 400 for controlling the temperature of the outer surface of outer wall 402. Heating/cooling temperature controller 416 may control heat exchange gas or liquid that may flow between outer wall 402 and inner wall 404 of substrate support 400 to control the deposition temperature of substrate 116, outer surface of outer wall 402, and thin film solar cell material 418. In one embodiment, rotational coupler 414 may be in fluid communication with a supply of fluid or gas that is used to control the temperature through substrate support 400. The fluid or gas may be used as a heat exchange fluid or gas that is supplied between outer wall 402 and inner wall 404 and/or the inside of substrate support 400 to contact its surfaces. Rotational coupler 414 facilitates the transmission of such fluids or gases to and from outer wall 402, inner wall 404, and substrate support 400.

As illustrated, thin film solar cell material 418 is deposited on substrate 116 of substrate support 400. Substrate 116 may be made from a corrosive resistant material, such as stainless steel or high temperature polyimide film, to avoid any degradation due to the process of depositing a substrate on the outer surface of substrate 116. Preferably, substrate 116 is a flexible material, such as sheets of stainless steel or high temperature polyimide film, for example. In one embodiment, the cross-sectional shape of substrate support 400 is cylindrical; however, this cross-sectional shape may be any shape desired. In addition, the surface area of the outer surface of outer wall 402 may be any size or dimension to suit a particular application or to produce any desirably sized solar cell, module, and/or panel. For example, substrate support 400 having a cylindrical shape that has a length of approximately 150 cm (or longer) and a diameter of approximately 30 cm (or larger) may produce a substrate 116 of approximately 94 by 150 cm, or approximately 3 by 5 ft. As would be commonly understood, the size, shape, and dimensions of substrate support 400 may be any size, shape, or dimension to fit a desired application. For example, for running test runs, a smaller substrate support 400 may be used, such that time, energy, and materials are conserved when producing the test run.

Gas supply 138 may be chemical element, compound, or mixture that is conducive to operation within plasma vapor deposition torch 108. In one embodiment, gas supply 138 may be a gas that forms a plasma when injected into plasma vapor deposition torch 108. In one embodiment, gas supply 138 may gas that has a low activation energy and that possesses a chemically inert characteristic such that no oxide or nitride will be formed in the plasma flame of the plasma vapor deposition torch 108. In one embodiment, gas supply 138 is Argon.

Source chemical supply 136 which is the supply of source chemicals that are fed to injection ports 210 are chemical elements, compounds, and/or mixtures for producing the desired thin film solar cell material 418 on substrate 116 on substrate supports 114 and 400. Source chemicals may include or be additional forms of matter such as gases, vapors, aerosols, small particles, or powders. Nanoparticle powders of semiconductor materials, such as pure silicon may be introduced to plasma vapor deposition torch 200 at the appropriate position in an inert atmosphere, such as Argon in atmospheric or vacuum conditions. The reaction product that is deposited as thin film solar cell material 418 on substrate 116 on substrate supports 114 and 400 is preferably a single element, compound, or mixture of elements or compounds and includes elements and compounds as copper, indium, gallium, selenium, silicon, intrinsic I-type layers, p-type doped silicon layers, and n-type doped silicon. In one embodiment, the reaction product is a copper indium gallium diselenide ("CIGS") layer that is found in solar cells. In addition, system for making solar cell modules and panels 100 may be used for depositing other types of thin film materials for making solar cells, such as CIGS, Cadmium Telluride ("CdTe"), or a combination of Silicon and Copper Gallium DiSelenide. Other Chalcogenide thin film materials may also be produced with system for making solar cell modules and panels 100 for making solar cells.

Typical solar cells, modules, and/or panels produced by system for making solar cell modules and panels 100 will have p-n, p-i-n, or n-i-p layer structures. For intrinsic silicon (i-type layer), silane ($SiH_4$) is the most common material used for these silicon layers. In addition, hydrogen ($H_2$) gas may be added to the source chemicals for making the desired Si: H i-type layer. For p-type doped silicon, either a $SiH_4$, $CH_4$, and $B_2H_6$ gas mixture or a $SiH_4$, $H_2$, and Trimethylboron $B(CH_3)_3$ gas mixture may be used, for example. For n-type doped silicon, either a $SiH_4$ and $PH_3$ gas mixture or a $SiH_4$, $H_2$, and $PH_3$ gas mixture may be used, for example. Substrate 116 and thin film solar cell material 418 may be any desired size including those sizes commonly known in the art of solar cells, modules, and panels.

When depositing layers of thin film solar cell material 418 containing Germanium, Germanium Hydride ($GeH_4$) may be a preferred compound. In addition, Germanium Tetrachloride ($GeCl_4$) or Germanium Tetrafluoride ($GeF_4$) may also be used. Furthermore, commercially available chemical delivery systems may be purchased from known manufacturers for use with system for making solar cell modules and panels 100. For example, Applied Materials produces available chemical delivery systems that may be used with system for making solar cell modules and panels 100.

Figure 5:
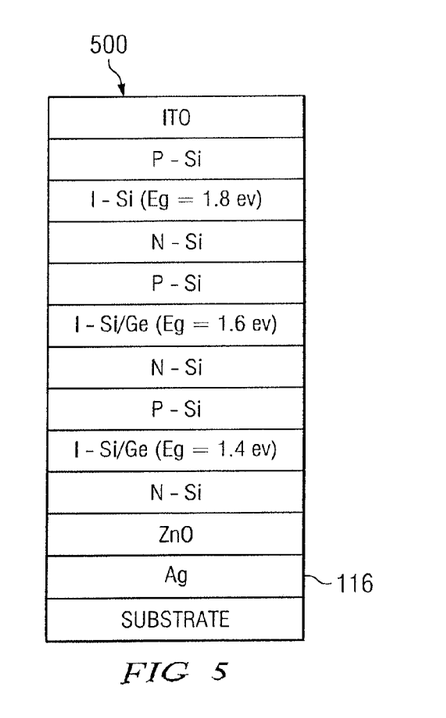
FIG. 5 illustrates a stacked arrangement of thin film material layers of an exemplary solar cell according to an embodiment of the present invention.

Referring now to FIG. 5, an illustration of an embodiment of a structure design of a triple junction photovoltaic cell 500 is shown. System for making solar cell modules and panels 100 deposits the layers shown in triple junction photovoltaic cell 500 without having to relocate substrate support 114 to different deposition chambers. System for making solar cell modules and panels 100 deposits these layers by the source chemicals being changed or switched between after deposition of the preceding layer. Because substrate support 114 may be a rotating cylinder relative to plasma vapor deposition torch 108, substrate 116 provides a large surface area on which to deposit these thin film solar cell materials 418.

Figure 6:
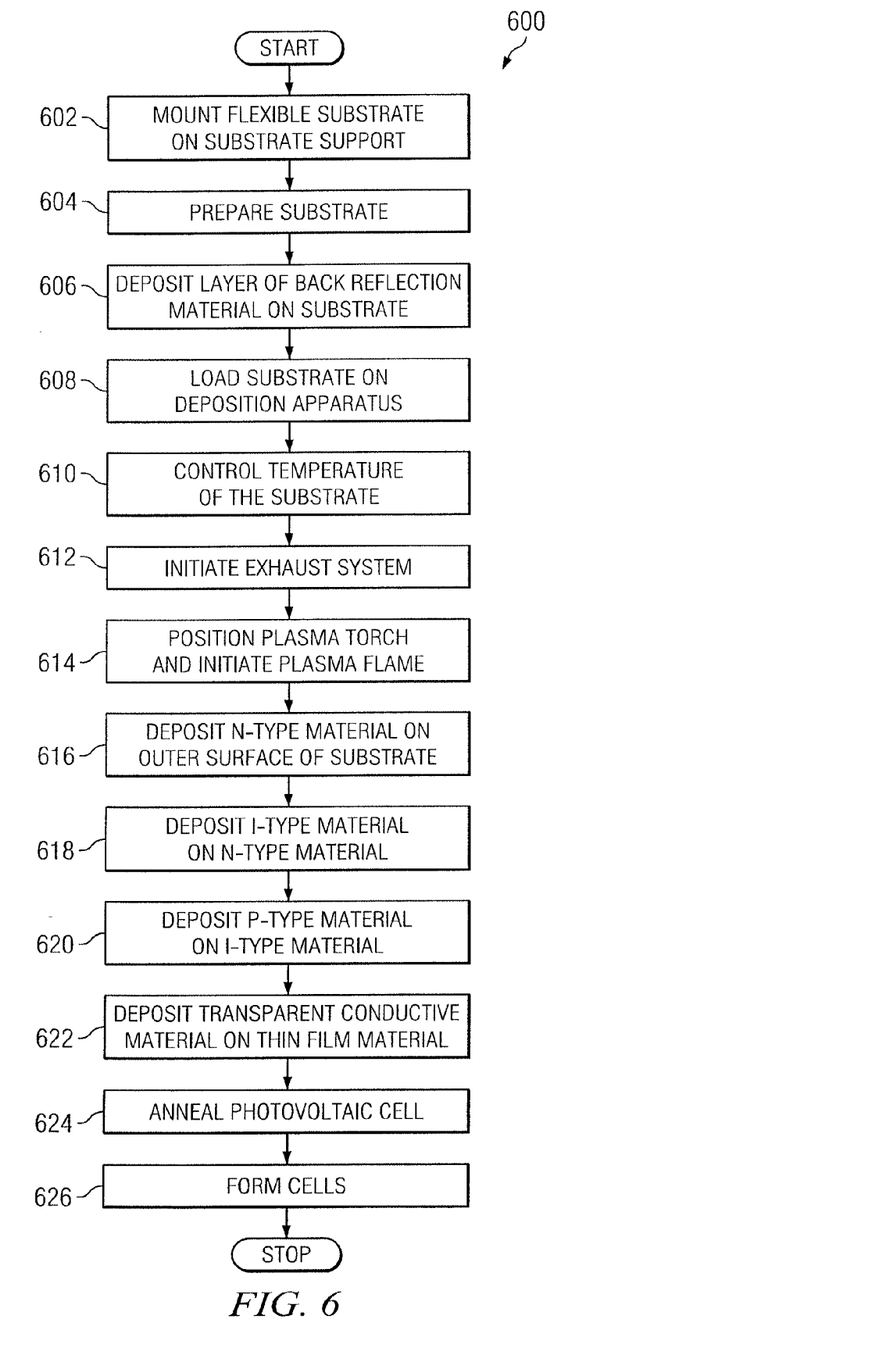
FIG. 6 illustrates a flow diagram of an exemplary process for making solar cells according to an embodiment of the present invention.

In addition to the aforementioned aspects and embodiments of the present system for making solar cell modules and panels 100, the present invention further includes a method for making thin film silicon photovoltaic solar cell. FIG. 6 illustrates a flow diagram of an embodiment 600 of one such process. In this embodiment, a N-I-P type film silicon photovoltaic cell on a substrate 116 is made. In step 602, a substrate 116 is mounted or secured to the outer surface of substrate support 114 or 400. In one embodiment, substrate 116 may be a flexible stainless steel foil with a thickness of approximately 125 micrometers, for example. In step 604, the outer surface of substrate 116 may be washed, cleaned, and preferably dried.

In step 606, a back reflection material is deposited on the outer surface of substrate 116. In one embodiment, the back reflection material may be Ag and ZnO, or Al and ZnO. In step 608, substrate support 114, 400 is mounted to tailstock 112 and headstock 110 of platform 106. This step may further include connecting fluid or gas exchange sources to rotational coupler 414 for providing an heat exchange medium to substrate support 114, 400.

In step 610, the temperature of chamber 102, substrate support 114, and/or substrate 116 are temperature controlled by heating/cooling temperature controller 416. An exemplary temperature is approximately 350° C., for example. Other temperatures may be used in accordance with one skilled in the art. In one aspect, the pressure within chamber 102 will be close to atmospheric pressure and the temperature range may further be from 150° C. to 400° C., for example.

In step 612, exhaust subsystem 104 is initiated or operated to remove any by-product gases and un-deposited reactant products during the deposition steps as described further below. Additionally, exhaust subsystem 104 may be used to balance, maintain, or control the pressure within chamber 102 to approximately atmospheric pressure, for example.

In step 614, plasma vapor deposition torch 108 may be located or positioned in an initial position relative to substrate support 114 and substrate 116. In one aspect, plasma vapor deposition torch 108 may be positioned at one end or the other of substrate support 114 and substrate 116. This step may further include rotating substrate support 114 and substrate 116 relative to plasma vapor deposition torch 108 in direction 124, for example. In another aspect, plasma vapor deposition torch 108 may be rotated relative to substrate support 114 and substrate 116. This step may further include igniting the plasma flame 140 of plasma vapor deposition torch 108. This step may further include stabilizing plasma flame 140 and injecting the source chemicals from source chemical supply 136 into the plasma flame 140. Further, substrate support 114 and substrate 116 may then be moved or traversed by headstock 110 and tailstock 112 relative to plasma vapor deposition torch 108 to deposit a thin layer of the thin film solar cell material 418 on substrate 116. This may include injecting source chemicals source chemical supply 136 in the presence of plasma flame 140. This step may further include traversing headstock 110 and tailstock 112 relative to plasma vapor deposition torch 108.

In step 616, a thin layer of thin film solar cell material 418 is deposited on the outer surface of substrate support 114. In one embodiment, the first layer of thin film material may be a N-type doped silicon where the source chemicals may be $SiCl_4$, $H_2$, and $PH_3$. Headstock 110 and tailstock 112 may traverse or move back and forth or traverse plasma vapor deposition torch 108 such that a desired thickness of the thin layer material is deposited on the outer surface of substrate 116. This process may further be controlled by controlling the flow rates of the source chemicals, in addition to the speed of the rotation and the traverse speed of the headstock 110 and tailstock 112. The $SiCl_4$ may be used as a source chemical for the silicon. In addition, the source chemical for the silicon may also be $SiHCl_3$, $SiH_4$, and/or $SiF_4$, for example. Mixtures of the compounds may also be used as the source chemicals of the silicon, for example. In one embodiment, this layer of thin film solar cell material 418 may have a thickness of approximately from about 0.2 micrometers to about 0.5 micrometers. In one embodiment, the thickness of this layer of thin film solar cell material 418 may be controlled by the rotational speed or velocity of substrate 116 on substrate support 114 relative to plasma vapor deposition torch 108. Further, the flow rates of source chemicals from source chemical supply 136 may be controlled to further provide control of the thickness of the deposition of thin film solar cell material 418. Also, the velocity of the traversing motion of headstock 110, tailstock 112, headstock 114, and substrate 116 relative to plasma vapor deposition torch 108 may further provide control for the thickness of the deposition of thin film solar cell material 418.

In step 618, a thin film layer of a second material is deposited on the outer surface of thin film solar cell material 418. In one aspect, the previous layer of thin film solar cell material 418 is the surface on which this second material is deposited. In one embodiment, the second layer of thin film solar cell material 418 may be an I-Type silicon by ceasing the flow of the $PH_3$ and increasing the supply of $H_2$ to plasma flame 140. Headstock 110 and tailstock 112 may traverse over the plasma vapor deposition torch 108 back and forth until a desired thickness of the I-Type silicon is deposited on thin film solar cell material 418. In one embodiment, the thickness of this layer may be from about 1 micrometer to about 5 micrometer, and more preferably from about 1 micrometer to about 2 micrometer.

In step 620, a thin film layer of a third material may be deposited on the outer surface of thin film solar cell material 418. In one embodiment, the third layer of thin film material may be a P-Type doped silicon material. The supply of $H_2$ to the plasma flame 140 may be decreased or reduced and the $B_2H_6$ may be added to the mixture of source chemicals. Headstock 110 and tailstock 112 may continue to traverse over the plasma vapor deposition torch 108 until a desired thickness of the P-Type material is deposited. In one embodiment, the thickness of this layer may be from about 0.3 micrometer to about 0.8 micrometer.

Collectively, steps 602-620 produce a formed n-i-p photovoltaic solar cell in one embodiment. Any of the preceding steps may be repeated in any desired order to provide additional flexibility of making photovoltaic cells in accordance with system for making solar cell modules and panels 100. At the end of the deposition steps, the source chemicals may be stopped and plasma flame 140 may be turned off. Also, the rotating and transversing functions may be stopped as well. Then substrate support 114 may be removed from headstock 110, tailstock 112 and chamber 102. In step 622, a layer of transparent conductive metal oxide ("TCO") may be deposited on thin film solar cell material 418 as a top electrode and anti-reflecting coating. In one embodiment, the TCO layer may be deposited by either a separate process or by plasma vapor deposition torch 108. This step may include depositing the TCO in a vacuum evaporation process chamber as is commonly known to those skilled in the art. The TCO material may be a single or mixture of oxides, including oxide of Indium, Tin, or Zinc. Mixtures of Indium and Tin Oxides may be used and are commonly referred to as ITO. In step 624, n-i-p photovoltaic cell including substrate 116 is further removed from substrate support 114 and annealed to remove the stress due to bending, for example. In step 626, standard laser patterning equipment may be used to form a desired number of photovoltaic cells from the photovoltaic cell to meet desired design requirements for voltage and amperage. This process produces a photovoltaic cell, which may then be further processed into a photovoltaic module or panel and assembled into a photovoltaic system.

Figure 7:
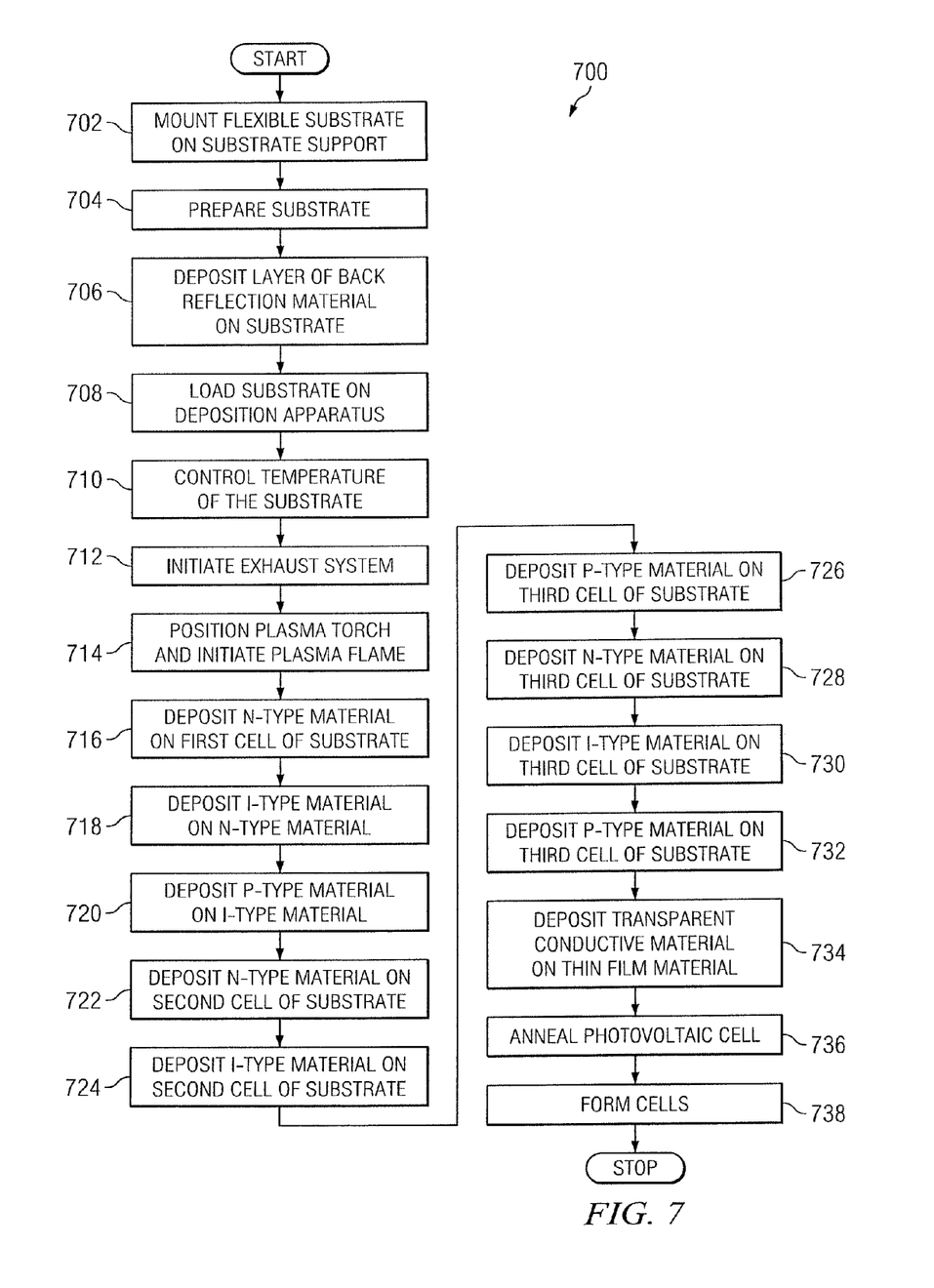
FIG. 7 illustrates a flow diagram of another exemplary process for making solar cells according to an embodiment of the present invention.

Referring now to FIG. 7, a flow diagram of an embodiment 700 a process for making a multiple-junction photovoltaic solar cell is further illustrated and described. In step 702, a substrate 116 is mounted or secured to the outer surface of substrate support 114 or 400. In one embodiment, substrate 116 may be a flexible stainless steel foil with a thickness of approximately 125 micrometers, for example. In step 704, the outer surface of substrate 116 may be washed, cleaned, and preferably dried. In step 706, a back reflection material is deposited on the outer surface of substrate 116. In one embodiment, the back reflection material may be Ag and ZnO, or Al and ZnO. In step 708, substrate support 114, 400 is mounted to tailstock 112 and headstock 110 of platform 106. This step may further include connecting fluid or gas exchange sources to rotational coupler 414 for providing an heat exchange medium to substrate support 114, 400.

In step 710, the temperature of chamber 102, substrate support 114, and/or substrate 116 are temperature controlled by heating/cooling temperature controller 416. An exemplary temperature is approximately 350° C., for example. Other temperatures may be used in accordance with one skilled in the art. In one aspect, the pressure within chamber 102 will be close to atmospheric pressure and the temperature range may further be from 150° C. to 400° C., for example.

In step 712, exhaust subsystem 104 is initiated or operated to remove any by-product gases and un-deposited reactant products during the deposition steps as described further below. Additionally, exhaust subsystem 104 may be used to balance, maintain, or control the pressure within chamber 102 to approximately atmospheric pressure, for example.

In step 714, plasma vapor deposition torch 108 may be located or positioned in an initial position relative to substrate support 114 and substrate 116. In one aspect, plasma vapor deposition torch 108 may be positioned at one end or the other of substrate support 114 and substrate 116. This step may further include rotating substrate support 114 and substrate 116 relative to plasma vapor deposition torch 108 in direction 124, for example. In another aspect, plasma vapor deposition torch 108 may be rotated relative to substrate support 114 and substrate 116. This step may further include igniting the plasma flame 140 of plasma vapor deposition torch 108. This step may further include stabilizing plasma flame 140 and injecting the source chemicals from source chemical supply 136 into the plasma flame 140. Further, substrate support 114 and substrate 116 may then be moved or traversed by headstock 110 and tailstock 112 relative to plasma vapor deposition torch 108 to deposit a thin layer of the thin film solar cell material 418 on substrate 116. This may include injecting source chemicals source chemical supply 136 in the presence of plasma flame 140. This step may further include traversing headstock 110 and tailstock 112 relative to plasma vapor deposition torch 108.

In step 716, a thin layer of thin film solar cell material 418 is deposited on the outer surface of substrate support 114. In one embodiment, the first layer of thin film material may be a N-type doped silicon where the source chemicals may be $SiCl_4$, $H_2$, and $PH_3$. Headstock 110 and tailstock 112 may traverse or move back and forth or traverse plasma vapor deposition torch 108 such that a desired thickness of the thin layer material is deposited on the outer surface of substrate 116. This process may further be controlled by controlling the flow rates of the source chemicals, in addition to the speed of the rotation and the traverse speed of the headstock 110 and tailstock 112. The $SiCl_4$ may be used as a source chemical for the silicon. In addition, the source chemical for the silicon may also be $SiHCl_3$, $SiH_4$, and/or $SiF_4$, for example. Mixtures of the compounds may also be used as the source chemicals of the silicon, for example. In one embodiment, this layer of thin film solar cell material 418 may have a thickness of approximately from about 0.2 micrometers to about 0.5 micrometers. In one embodiment, the thickness of this layer of thin film solar cell material 418 may be controlled by the rotational speed or velocity of substrate 116 on substrate support 114 relative to plasma vapor deposition torch 108. Further, the flow rates of source chemicals from source chemical supply 136 may be controlled to further provide control of the thickness of the deposition of thin film solar cell material 418. Also, the velocity of the traversing motion of headstock 110, tailstock 112, substrate support 114, and substrate 116 relative to plasma vapor deposition torch 108 may further provide control for the thickness of the deposition of thin film solar cell material 418.

In step 718, a thin film layer of a second material is deposited on the outer surface of thin film solar cell material 418. In one aspect, the previous layer of thin film solar cell material 418 is the surface on which this second material is deposited. In one embodiment, the second layer of thin film solar cell material 418 may be an I-Type silicon by ceasing the flow of the $PH_3$ and initiating a supply of $GeH_4$ and $H_2$ to plasma flame 140. Headstock 110 and tailstock 112 may traverse plasma vapor deposition torch 108 back and forth until a desired thickness of the I-Type silicon is deposited on thin film solar cell material 418. In one embodiment, the thickness of this layer may be from about 1 micrometer to about 5 micrometer, and more preferably from about 1 micrometer to about 2 micrometer.

In step 720, a thin film layer of a third material may be deposited on the outer surface of thin film solar cell material 418. In one embodiment, the third layer of thin film material may be a P-Type doped silicon material. The supply of $GeH_4$ will be turned off, and $H_2$ may be decreased or reduced to the plasma flame 140; and the $B_2H_6$ may be added to the mixture of source chemicals. Headstock 110 and tailstock 112 may continue to traverse plasma vapor deposition torch 108 until a desired thickness of the P-Type material is deposited. In one embodiment, the thickness of this layer may be from about 0.3 micrometer to about 0.8 micrometer.

In step 722, a first layer of a second solar cell is produced on thin film solar cell material 418. In this step, a layer of thin film first material is deposited for a second solar cell on the outer surface of thin film solar cell material 418. In one embodiment, the first layer of thin film material may be a N-type doped silicon where the source chemicals may be $SiCl_4$, $H_2$, and $PH_3$. In addition, the previous supply of $B_2H_6$ will be turned off and a supply of $PH_3$ will be supplied to plasma flame 140. Headstock 110 and tailstock 112 may move or traverse back and forth or traverse plasma vapor deposition torch 108 such that a desired thickness of the thin layer material is deposited on the outer surface of thin film solar cell material 418. This process may further be controlled by controlling the flow rates of source chemicals, in addition to the speed of the rotation and the traverse speed of substrate support 114, substrate 116, headstock 110, and tailstock 112. In one embodiment, this layer of thin film solar cell material 418 may have a thickness of approximately from about 0.2 micrometers to about 0.5 micrometers. In one embodiment, the thickness of this layer of thin film solar cell material 418 may be controlled by the rotational speed or velocity of substrate 116 on substrate support 114 relative to plasma vapor deposition torch 108. Further, the flow rates of source chemicals from source chemical supply 136 may be controlled to further provide control of the thickness of the deposition of thin film solar cell material 418. Also, the velocity of the traversing motion of headstock 110, tailstock 112, substrate support 114, and substrate 116 relative to plasma vapor deposition torch 108 may further provide control for the thickness of the deposition of thin film solar cell material 418.

In step 724, a thin film layer of a second material for the second solar cell is deposited on the outer surface thin film solar cell material 418. In one embodiment, the second layer of thin film material may be an I-Type silicon-germanium produced by adding a supply of $GeH_4$, but less than that added in step 718 above. Preferably, the concentration of germanium is lower than the concentration of silicon. The supply of $PH_3$ may be turned off for during the deposition of this layer. In addition, the concentrations of $GeH_4$ and $H_2$ may be introduced into the plasma flame 30. Headstock 110 and tailstock 112 may traverse over plasma vapor deposition torch 108 back and forth until a desired thickness of the I-Type silicon is deposited on thin film solar cell material 418. In one embodiment, this layer of thin film solar cell material 418 may have a thickness of approximately from about 1 millimeters to 3 millimeters, and preferably 1.5 millimeters. The percentage of Ge in the SiGe compound for this layer will be between 10 to 20%. Nevertheless, the hydrogen content may also impact the bandgap of this layer. Higher hydrogen content may require more Ge in the SiGe compound to achieve the desired 1.6 ev bandgap, for example.

In step 726, a thin film layer of a third material for the second solar cell may be deposited on the outer surface of thin film solar cell material 418. In one embodiment, the third layer of thin film material may be a P-Type doped silicon material. The supply of $H_2$ to plasma flame 140 may be decreased or reduced and the supply of $GeH_4$ will be turned off and $B_2H_6$ may be added to the mixture of source chemicals supplied to plasma flame 140. Headstock 110 and tailstock 112 may continue to traverse over the plasma vapor deposition torch 108 until a desired thickness of the P-Type material is deposited. In one embodiment, this layer of thin film solar cell material 418 may have a thickness of approximately from about 0.2 micrometers to 0.8 micrometers. The steps 722-726 produce a second solar cell in the multiple-junction photovoltaic solar cell.

In step 728, a first layer of a third solar cell is produced on thin film solar cell material 418. In this step, a layer of thin film first material is deposited for a third solar cell on the outer surface of thin film solar cell material 418. In one embodiment, the first layer of thin film material may be a N-type doped silicon where the source chemicals may be $SiCl_4$, $H_2$, and $PH_3$. In addition, the previous supply of $B_2H_6$ may be turned off and a supply of $PH_3$ may be supplied to plasma flame 140. Headstock 110 and tailstock 112 may traverse or move back and forth or traverse plasma vapor deposition torch 108 such that a desired thickness of the N layer material is deposited on the outer surface of thin film solar cell material 418. This process may further be controlled by controlling the flow rates of source chemicals, in addition to the speed of the rotation and the traverse speed of headstock 110 and tailstock 112. In one embodiment, this layer of thin film solar cell material 418 may have a thickness of approximately from about 0.2 micrometers to 0.8 micrometers.

In step 730, a thin film layer of a second material for the third solar cell is deposited on the outer surface of thin film solar cell material 418. In one embodiment, the second layer of thin film material may be an I-Type silicon material produced by ceasing the flow of the $PH_3$ and increasing the supply of $H_2$ to plasma flame 140. Headstock 110 and tailstock 112 may traverse over the plasma vapor deposition torch 108 back and forth until a desired thickness of the I-Type silicon is deposited on thin film solar cell material 418. In one embodiment, this layer of thin film solar cell material 418 may have a thickness of approximately from about 0.8 micrometers to 1.0 micrometers, but may be as thick as 2 micrometers, for example.

In step 732, a thin film layer of a third material for the third solar cell may be deposited on the outer surface of thin film solar cell material 418. In one embodiment, the third layer of thin film material may be a P-Type doped silicon material. The supply of $H_2$ to plasma flame 140 may be decreased or reduced and a supply of $B_2H_6$ may be added to the mixture of source chemicals supplied to plasma flame 140. Headstock 110 and tailstock 112 may continue to traverse over the plasma vapor deposition torch 108 until a desired thickness of the P-Type material is deposited. In one embodiment, this layer of thin film solar cell material 418 may have a thickness of approximately from about 0.2 micrometers to 0.5 micrometers. The steps 722-726 produce a third solar cell in the multiple-junction photovoltaic solar cell.

Collectively, steps 702-732 produce a formed triple-junction photovoltaic solar cell. Any of the preceding steps may be repeated in any desired order to provide additional flexibility of making photovoltaic cells in accordance with system for making solar cell modules and panels 100. At the end of the deposition steps, the source chemicals may be stopped and plasma flame 140 may be turned off. Also, the rotating and transversing functions may be stopped as well. Then substrate support 114 may be removed from headstock 110, tailstock 112 and chamber 102. In step 734, a layer of transparent conductive metal oxide ("TCO") may be deposited on thin film solar cell material 418 as a top electrode and anti-reflecting coating. In one embodiment, the TCO layer may be deposited by either a separate process or by plasma vapor deposition torch 108. This step may include depositing the TCO in a vacuum evaporation process chamber as is commonly known to those skilled in the art. The TCO material may be a single or mixture of oxides, including oxide of Indium, Tin, or Zinc. Mixtures of Indium and Tin Oxides may be used and are commonly referred to as ITO. In step 736, n-i-p photovoltaic cell including substrate 116 is further removed from substrate support 114 and annealed to remove the stress due to bending, for example. In step 738, standard laser patterning equipment may be used to form a desired number of photovoltaic cells from the photovoltaic cell to meet desired design requirements for voltage and amperage. This process produces a photovoltaic cell, which may then be further processed into a photovoltaic module or panel and assembled into a photovoltaic system.

In addition to the above, system for making solar cell modules and panels 100 may be used to manufacture a triple junction solar cell of amorphous silicon ("a-Si"), crystalline Si—Ge ("c-Si—Ge"), and microcrystalline Si, on a flexible substrate 116, such as the stainless steel foil as described herein.

Generally, a larger area photovoltaic cell will collect more solar energy and be better able to convert more optical energy into electrical power than a smaller area photovoltaic cell. Nevertheless, in order to better utilize the generated energy, it is preferable to break the large cells into small ones and make proper interconnections between the individual solar cells to form a module or panel that will have the desired output characteristics, such as open circuit voltage ("$V_{OC}$"), short circuit current ("$I_{SC}$"), and fill factor ("FF"), which is defined as the maximum power produced at the maximum power point, divided by the product of $I_{SC}$ and $V_{OC}$. To convert the solar cells into a solar module, the apparatus may include a laser scribing sequence that enables the front and back of adjacent solar cells to be directly interconnected in series with no need for further solder connections between the cells. There exist two common methods for forming these interconnections on a solar module.

One method uses a scribing process with a laser that scribes after each individual layer is deposited or formed, while the other method scribes after all of the layers have been deposited or formed. The later method involves scribing all the layers after they have been deposited and is a method that can be used after the completed thin film solar cell material 418 is removed from substrate 116 and substrate support 114. The thin film solar cell material 418 or photovoltaic cell as described herein may be mounted on a laser scribing system, as known commonly in the art. Some exemplary systems are manufactured by U.S. Laser Corp. and the Synova/Manz Automation entity.

The former method includes scribing after each layer of thin film is deposited. This method may not require thin film solar cell material 418 to be removed from substrate support 114 and substrate 116, but just that the scribing process is performed after each thin film layer is deposited. Preferably, a laser system with an optical fiber bundle and focusing optics to deliver the high power laser energy may be used. The end of the fiber bundle may be mounted on the outside of substrate support 114 and substrate 116 and aimed toward thin film solar cell material 418 where the deposited thin film is located. When the rotating motion of substrate support 114 and substrate 116 stops, then transverse motion of headstock 110 and tailstock 112 can scribe the line parallel to the longitudinal axis of thin film solar cell material 418, for example. When the transverse motion stops, then the rotating motion of substrate support 114 and substrate 116 will scribe the lines perpendicular to the longitudinal axis of thin film solar cell material 418. With proper index for each line, the designed module pattern may be easily formed. One exemplary laser system is manufactured by Newport Corporation or Coherent Corporation. Additionally, a fiber laser system for scribing the interconnected grids and cells may be used to form the solar cell module.

The present apparatus for making solar cell modules and panels does not require the need to move the target or substrate from one chamber to another chamber, back and forth, to deposit layers of different composition. The present apparatus for making solar cell modules and panels preferably just changes the supply of different chemicals to plasma flame 140 as described herein. This not only reduces the processing time, but also has the advantage to allow users to build multiple junction cells when it is desirable, without adding more chambers. Further, the present apparatus for making solar cell modules and panels deposits thin films with a capability of producing different sizes; the present apparatus for making solar cell modules and panels allows for easily changing the length and/or diameter of substrate support 114 and substrate 116 used in the deposition process. For example, the present system for making solar cell modules and panels may be used to deposit these thin film layers on substrate 116 having a size of approximately 94 cm×150 centimeters, in one example, which is approximately two order of magnitude larger than the area reported in the prior art.

In one embodiment, the present apparatus for making solar cell modules and panels includes using different materials that may have similar crystal structure with different band gaps. For example, silicon and germanium have similar crystal structures, but with different band gaps. In addition, as the mixing ratio of the silicon and germanium may be changed, which may also change the band gap. When using the mixture of both as an absorbing layer on a photovoltaic cell, they can be configured to absorb the photon energy from a different wavelength region of the solar spectra. The present system for making solar cell modules and panels includes making a solar cell with multiple tandem thin film layers of silicon and silicon-germanium alloy, the solar cell may allow more solar energy to be absorbed, thus it will improve the efficiency of the photovoltaic cell. Because of the similarity in the crystal structure of the silicon and germanium, there will be fewer concerns with the mismatch between the layers.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed:

1. A plasma vapor deposition method for making multi-junction silicon thin film solar cell modules and panels, comprising:
   providing a rotatable substrate support;
   providing a high frequency induction coupled plasma torch comprising a coil, the induction coupled plasma torch being selectively positionable along the surface area of rotatable substrate support;
   mounting a flexible sheet-like substrate about an outer surface of the rotatable substrate support, the flexible sheet-like substrate substantially taking the shape of the rotatable substrate support;
   introducing a plasma gas into the high frequency induction coupled plasma torch to form a plasma within the coil;
   injecting at least one source chemical into the high frequency induction coupled plasma torch; and
   depositing at least one thin film layer on the outer surface of the sheet-like flexible substrate, wherein the depositing includes traversing the sheet-like flexible substrate back and forth along a longitudinal axis of the rotatable substrate support.

2. The plasma vapor deposition method for making multi-junction silicon thin film solar cell modules and panels of claim 1, further comprising:
   controlling the temperature of the rotatable substrate support.

3. The plasma vapor deposition method for making multi-junction silicon thin film solar cell modules and panels of claim 1, further comprising:
   flowing one of a gas and a liquid through the rotatable substrate support to control its temperature.

4. The plasma vapor deposition method for making multi-junction silicon thin film solar cell modules and panels of claim 1, further comprising:
   rotating the sheet-like flexible substrate about the longitudinal axis of the rotatable substrate support relative to the high frequency induction coupled plasma torch.

5. The plasma vapor deposition method for making multi-junction silicon thin film solar cell modules and panels of claim 1, wherein depositing at least one thin film layer comprises:
   depositing at least one of a n-type doped silicon layer, a i-type doped silicon layer, and a p-type doped silicon layer on the outer surface of the sheet-like flexible substrate.

6. The plasma vapor deposition method for making multi-junction silicon thin film solar cell modules and panels of claim 1, wherein the at least one source chemicals is selected from the group consisting of $SiCl_4$, $SiHCl_3$, $SiH_4$, $SiF_4$, and other silicon containing compound.

7. The plasma vapor deposition method for making multi-junction silicon thin film solar cell modules and panels of claim 1, wherein the at least one source chemicals is selected from the group consisting of $PH_3$ and $B_2H_6$.

8. The plasma vapor deposition method for making multi-junction silicon thin film solar cell modules and panels of claim 1, wherein the at least one source chemicals is selected from the group consisting of GeH$_4$, GeCl$_4$, GeF$_4$, and other germanium containing compounds.

9. The plasma vapor deposition method for making multi-junction silicon thin film solar cell modules and panels of claim 1, wherein the source chemicals are in a form selected from the group consisting of a gas, vapor, aerosol, small particle, and powder.

10. The plasma vapor deposition method for making multi-junction silicon thin film solar cell modules and panels of claim 1, wherein the depositing at least one thin film layer further comprises:
 depositing a thin film layer of transparent conductive metal oxide on the outer surface of the sheet-like flexible substrate after the deposition of the at least one thin film layer.

11. The plasma vapor deposition method for making multi-junction silicon thin film solar cell modules and panels of claim 10, wherein the transparent conductive metal oxide is an oxide selected from the group consisting of indium, tin, and zinc.

12. The plasma vapor deposition method for making multi-junction silicon thin film solar cell modules and panels of claim 1, wherein the plasma gas is selected from the group consisting of helium, neon, argon, hydrogen and mixtures thereof.

13. The plasma vapor deposition method for making multi-junction silicon thin film solar cell modules and panels of claim 1, wherein the silicon thin film solar cell modules are selected from the group consisting of p-i-n and n-i-p type layered structures.

14. The plasma vapor deposition method for making multi-junction silicon thin film solar cell modules and panels of claim 1, further comprising:
 cutting the solar cell modules into smaller portions to be mounted on a substrate for producing a solar cell panel.

15. The plasma vapor deposition method for making multi-junction silicon thin film solar cell modules and panels of claim 1, wherein the depositing includes depositing a triple junction photovoltaic cell without adding more chambers for deposition.

16. The plasma vapor deposition method for making multi-junction silicon thin film solar cell modules and panels of claim 1, wherein the rotatable substrate support and the high frequency induction coupled plasma torch include adjustable height mechanisms for adjusting the distance between the high frequency induction coupled plasma torch and the rotatable substrate support.

17. The plasma vapor deposition method for making multi-junction silicon thin film solar cell modules and panels of claim 16, further comprising:
 continually adjusting a distance between successively deposited layers on the flexible sheet-like substrate and the high frequency induction coupled plasma torch to provide for the distance to remain constant.

\* \* \* \* \*